United States Patent [19]
Tomita et al.

[11] Patent Number: 5,666,706
[45] Date of Patent: Sep. 16, 1997

[54] METHOD OF MANUFACTURING A PIEZOELECTRIC ACOUSTIC WAVE DEVICE

[75] Inventors: Yoshihiro Tomita; Akihiro Kanaboshi, both of Osaka; Yutaka Taguchi, Ibaragi; Kazuo Eda, Nara, all of Japan

[73] Assignee: Matsushita Electric Industrial Co., Ltd., Osaka, Japan

[21] Appl. No.: 438,966

[22] Filed: May 11, 1995

Related U.S. Application Data

[62] Division of Ser. No. 255,743, Jun. 7, 1994, abandoned.

[30] Foreign Application Priority Data

Jun. 10, 1993 [JP] Japan ................... 5-138192

[51] Int. Cl.⁶ .................................................. H01L 41/22
[52] U.S. Cl. ................................... 29/25.35; 29/424
[58] Field of Search ................... 29/25.35, 424; 310/344, 340, 346, 348, 320, 321

[56] References Cited

U.S. PATENT DOCUMENTS

| | | |
|---|---|---|
| 3,239,908 | 3/1966 | Nakamura . |
| 3,924,312 | 12/1975 | Coussot . |
| 4,009,516 | 3/1977 | Chiang et al. .................... 29/25.35 |

FOREIGN PATENT DOCUMENTS

| | | |
|---|---|---|
| 0 503 892 | 9/1992 | European Pat. Off. . |
| 0 531 985 | 3/1993 | European Pat. Off. . |
| 62-27040 | 6/1987 | Japan . |
| 63-285195 | 11/1988 | Japan . |

OTHER PUBLICATIONS

M. Shinpo; Bonding Method of Silicon Crystalline Body, Abstract of JP 60–51700(A) dated Mar. 23, 1985 which is the first Laid–open application of JP 62–27040.

*Primary Examiner*—Carl E. Hall
*Attorney, Agent, or Firm*—Morrison & Foerster

[57] ABSTRACT

A piezoelectric acoustic wave device includes a substrate and a piezoelectric plate. The piezoelectric plate includes a resonating part, and has a top electrode at least on the top surface of the resonating part. The substrate and the piezoelectric plate are directly bonded at an area where they are in contact with each other by a chemical bond such as a covalent bond and an ionic bond. A depression is formed in at least one of the substrate and the piezoelectric plate. The method of manufacturing the piezoelectric acoustic wave device includes the steps of forming a depression in at least one of the substrate and the piezoelectric plate, filling the depression with an intermediate support layer, cleaning the surfaces of the substrate and the piezoelectric plate to directly bond to each other by a chemical bond, forming electrodes, and removing the intermediate support layer.

9 Claims, 7 Drawing Sheets

METHOD OF MANUFACTURING A PIEZOELECTRIC ACOUSTIC WAVE DEVICE

This application is a division of U.S. application Ser. No. 08/255 743, filed Jun. 7, 1994, now abandoned.

FIELD OF THE INVENTION

The invention relates to a piezoelectric acoustic wave device used for high frequency resonators and filters. The invention also relates to a method of manufacturing the piezoelectric acoustic wave device.

BACKGROUND OF THE INVENTION

With the recent development of miniaturized high frequency communication devices such as portable telephones, there is a demand for piezoelectric acoustic wave devices (resonators and filters), used for these communication devices, which are smaller and have a higher frequency.

Conventional piezoelectric acoustic wave devices have been miniaturized by improving ways to support the packages and piezoelectric plates. The piezoelectric plates of conventional piezoelectric acoustic wave devices have been thinned to raise the frequencies of the devices. One conventional piezoelectric acoustic wave device, a quartz resonator, is explained by referring to FIG. 6.

Figure 6:
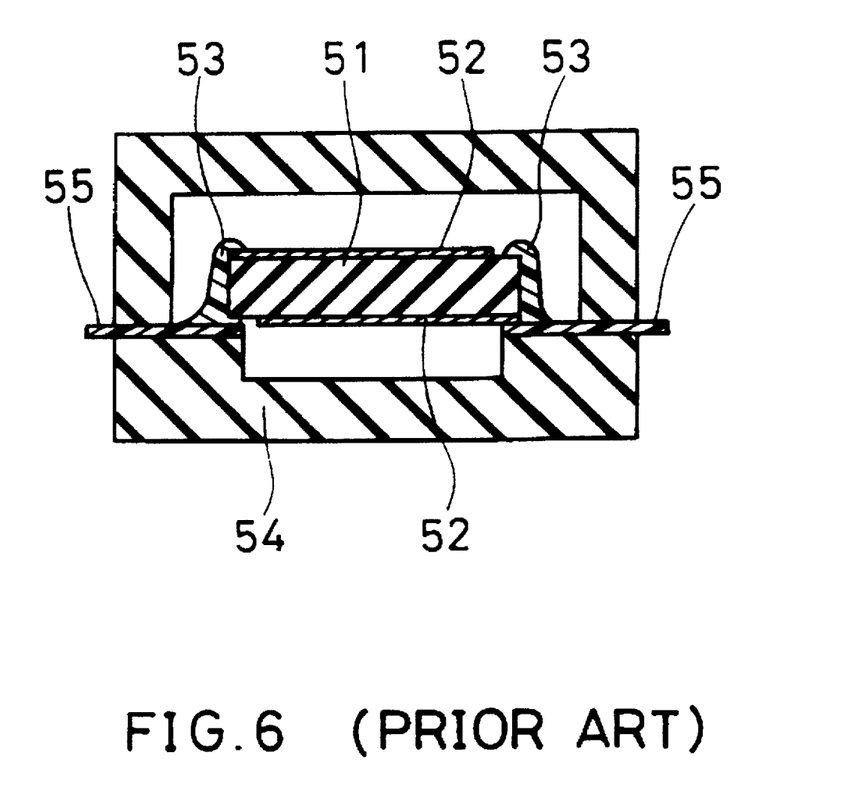
FIG. 6 is a cross sectional view of a conventional quartz resonator.

FIG. 6 is a cross-sectional view of a conventional quartz resonator. In FIG. 6, 51 is a quartz plate abraded to a thickness at which the plate can resonate at a preferable frequency. Exciting electrodes 52 are fixed to both surfaces of the quartz plate. Conductive adhesive 53 is used to fix two sides of quartz plate 51 to a package 54 while maintaining continuity between exciting electrodes 52 and a lead electrode 55.

A piezoelectric acoustic wave device cannot operate or has poor properties unless the resonating part is highly free from the substrate and the like. Therefore, in this conventional quartz resonator, quartz plate 51 is supported by fixing only two sides of the plate to package 54.

Since it is extremely difficult to treat an extremely thin piezoelectric plate with photolithography, film forming processes, mounting processes and the like, an acceptable minimum thickness of the plate is about 50 μm. The thickness of the piezoelectric plate should be at least about 50 μm so that the plate cannot be bent or cracked during an abrading treatment.

Quartz plates generally used for high frequency resonators are AT-cut quartz plates since the plates have small frequency deviations, which are caused by a change in temperature. The resonant frequency is in inverse proportion to the thickness of the quartz plate, and the fundamental resonant frequency of an about 50 μm thick quartz plate is 35 MHz. In other words, it is difficult to manufacture a quartz plate with a resonant frequency higher than 35 MHz. Thinning a quartz plate also becomes more difficult as the area of the plate becomes large.

Since a conductive adhesive spreads during a coating step, the size of a device is required to be large enough to have a sufficient area for the adhesive. The use of a resin to fix a quartz plate to a package fails to provide a piezoelectric acoustic wave device with long-term stability.

SUMMARY OF THE INVENTION

An object of the invention is to provide a highly stable miniaturized high frequency piezoelectric acoustic wave device. Another object is to provide a method of manufacturing the piezoelectric acoustic wave device with high yields.

These and other objects and advantages of the invention are attained by a piezoelectric acoustic wave device comprising a substrate and a piezoelectric plate. The piezoelectric plate includes a resonating part. A top electrode is formed at least on the top surface of the resonating part. The substrate and the piezoelectric plate, at an area where they are in contact with each other, are directly bonded by a chemical bond. A depression is formed in at least one of the substrate and the piezoelectric plate.

It is preferable that the piezoelectric plate has an opening partially surrounding the resonating part.

It is also preferable that the resonating part has a one side-supported beam structure.

It is preferable that the substrate having the depression is abraded to form a hole in the substrate.

It is preferable that the piezoelectric plate is made of at least one material selected from the group consisting of quartz, lithium niobate and lithium tantalate.

It is preferable that the substrate is made of at least one material selected from the group consisting of quartz, silicon, glass, lithium tantalate and lithium niobate.

It is preferable that the piezoelectric acoustic wave device further comprises a bottom electrode at least on the bottom surface of the resonating part.

It is preferable that the piezoelectric acoustic wave device further comprises a bottom electrode on the depression formed in the substrate, that a lead electrode is formed on the piezoelectric plate as a lead part for the bottom electrode, and that a space is formed between the piezoelectric plate and the bottom electrode.

It is preferable that the depression is formed in the bottom of the piezoelectric plate, that a bottom electrode is formed on the top surface of the substrate which is under the depression, that a lead electrode is formed partially on the bottom electrode and the piezoelectric plate as a lead part for the bottom electrode, and that a space is formed between the piezoelectric plate and the bottom electrode.

The method of manufacturing the piezoelectric acoustic wave device of the invention comprises the steps of:

forming a depression, which is larger than the resonating part of a piezoelectric plate, in at least one of a substrate and the piezoelectric plate;

filling the depression with an intermediate support layer and flattening the surface of the layer;

cleaning the surfaces of the substrate and the piezoelectric plate to directly bond the surfaces together by a chemical bond;

forming a top electrode at least on the top surface of the resonating part;

forming a bottom electrode; and dissolving and removing the intermediate support layer.

It is preferable in this method that the piezoelectric plate is abraded after it is directly bonded to the substrate.

It is preferable in this method that the piezoelectric plate is formed with an opening partially surrounding the resonating part.

It is preferable in this method that the depression formed in the substrate is abraded to form a hole in the substrate.

It is preferable in this method that the bottom electrode is formed on the depression of the substrate by the steps of forming an electrode film on the depression of the substrate, forming the intermediate support layer on the electrode film, and removing the intermediate support layer; and that a lead electrode is formed on the piezoelectric plate as a lead part for the bottom electrode.

It is preferable in this method that the bottom electrode is formed at least on the bottom surface of the resonating part.

It is preferable in this method that the bottom electrode is formed on the top surface of the substrate, and that a lead electrode is formed partially on the bottom electrode and the piezoelectric plate as a lead part for the bottom electrode.

It is preferable in this method that glass or an organic material which softens at a temperature lower than the temperature that will deteriorate the properties of the piezoelectric plate is used for the intermediated support layer.

It is preferable in this method that at least one material selected from the group consisting of quartz, lithium niobate and lithium tantalate is used for the piezoelectric plate.

It is preferable in this method that at least one material selected from the group consisting of quartz, silicon, glass, lithium tantalate and lithium niobate is used for the substrate.

BRIEF DESCRIPTION OF THE DRAWINGS

FIG. 1 (a) is a cross sectional view of a substrate and a piezoelectric plate, at the molecular level, after processing the surfaces of the substrate and the piezoelectric plate with a hydrophilic treatment.

FIG. 1 (b) is a cross sectional view of the substrate and the piezoelectric plate, at the molecular level, during a direct bonding process.

FIG. 1 (c) is a cross sectional view of the substrate and the piezoelectric plate, at the molecular level, after the direct bonding process.

FIG. 2 (a), FIG. 2 (b), FIG. 2 (c), FIG. 2 (d), FIG. 2 (e) and FIG. 2 (f) form a flow diagram showing the method of manufacturing a piezoelectric acoustic wave device of one example of the invention.

FIG. 3 (a), FIG. 3 (b), FIG. 3 (c), FIG. 3 (d), FIG. 3 (e) and FIG. 3 (f) form a flow diagram showing the method of manufacturing a piezoelectric acoustic wave device of another example of the invention.

FIG. 4 (a), FIG. 4 (b), FIG. 4 (c) and FIG. 4 (d) form a flow diagram showing the method of manufacturing a piezoelectric acoustic wave device of another example of the invention.

FIG. 5 (a), FIG. 5 (b), FIG. 5 (c) and FIG. 5 (d) form a flow diagram showing the method of manufacturing a piezoelectric acoustic wave device of another example of the invention.

DETAILED DESCRIPTION OF THE INVENTION

The bond strength between the substrate and the piezoelectric plate of the piezoelectric acoustic wave device of the invention is significantly high, since the two are directly bonded to each other by a chemical bond such as a covalent bond or an ionic bond. An adhesive used for conventional piezoelectric acoustic wave devices fixes a substrate to a piezoelectric plate by an intermolecular force, so that its adhesion is weak.

Figure 7:
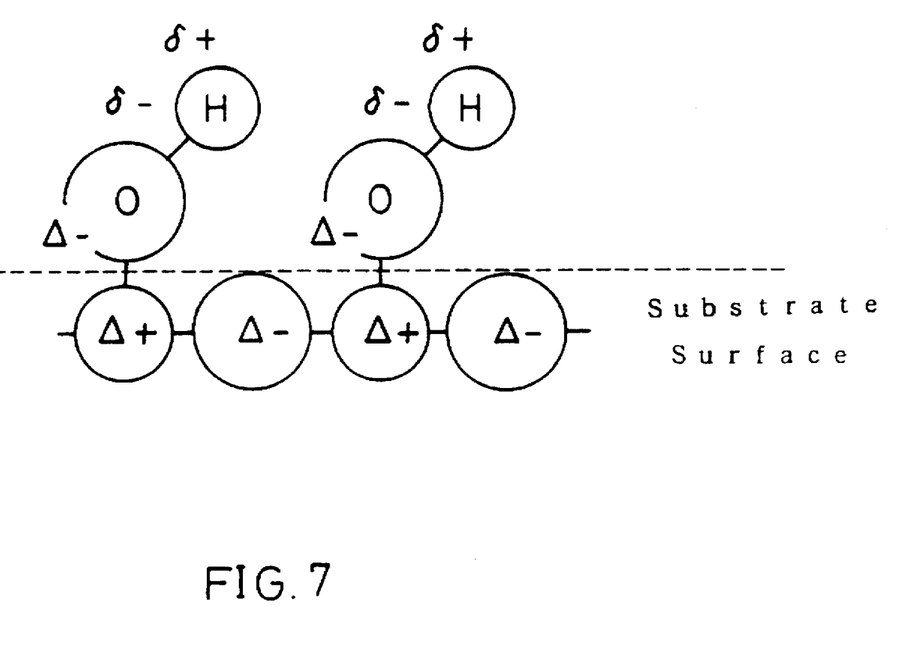
FIG. 7 is a cross sectional view of a substrate and —OH groups, at the molecular level.

The bond formed between lithium tantalate and lithium niobate is an ionic bond of a metal ion and an oxygen ion. In addition, ions of elements ($Li^+$, $Ta^{5+}$, $O^{2-}$) constituting $LiTaO_3$ are electrically attractive, and are bonded by an ionic bond. Examples of a covalent bond, on the other hand, are —Si—O— and —O—H—. Due to a difference in electronegativities of covalently bonded atoms, however, shared electrons move toward the atom with a larger electronegativity. As a result, the atom with the larger electronegativity has a negative electric charge while the atom with a smaller electronegativity has a positive electric charge. As the difference in electronegativities of covalently bonded atoms increases, the atoms are likely to be bonded by ionic bonding. FIG. 7 explains a covalent bond and an ionic bond. When $\Delta$ (electric charge induced by a difference in electronegativities) in a substrate shown in FIG. 7 is small, —OH groups and the substrate are covalently bonded to each other. However, if $\Delta$ is large, the bond between —OH groups and the substrate is likely to be the ionic bond of positive ions and negative ions. The following table shows electronegativities of selected elements. (The data is taken from page 892 of Iwanami Rikagaku Jiten, third edition, published by Iwanami Shoten, May 20, 1971.)

TABLE 1

| Elements | Li | Nb | Ta | Si | H | O |
|---|---|---|---|---|---|---|
| Electronegativity | 1.0 | 1.2 | 1.3 | 1.8 | 2.1 | 3.5 |

According to the method of manufacturing the piezoelectric acoustic wave device of the invention, the piezoelectric plate and the substrate are directly bonded to each other at an area where the depression is not formed, and the plate is bonded to the substrate via the intermediate support layer at the non-depression area. Thus, the entire surface of the piezoelectric plate is supported by the substrate. In other words, even if the piezoelectric plate is thin, the plate supported on the substrate is strong enough to endure treatments such as photolithography, film forming, mounting and the like.

The piezoelectric plate supported and bonded to the substrate by a chemical bond cannot be bent or cracked by abrasion. Therefore, thinning the piezoelectric plate so as to obtain a higher frequency is easily performed. By abrading the piezoelectric plate after directly bonding it to a highly flat substrate, the plate can be thinned while the flatness is maintained.

Direct bonding refers to bonding two cleaned substrates by a chemical bond such as a covalent bond or an ionic bond. By treating a directly bonded piezoelectric plate and substrate with heat, bonding strength between the plate and the substrate is increased. By arranging treatment conditions, it is possible to directly bond the piezoelectric plate on the substrate at the atomic level, so that the bonding strength becomes high enough to endure an abrading treatment directed to the piezoelectric plate.

Unlike conventional methods, the manufacturing method of the invention can form a resonating part which is apart from a substrate by using an intermediate support layer. The direct bonding between the piezoelectric plate and the substrate is maintained for a long period after dissolving and removing the intermediate support layer, while only a small area is required for bonding.

Therefore, in the manufacturing method of the invention, a thin piezoelectric plate is easily treated. Only a small area is required for direct bonding between the piezoelectric plate and the substrate.

The resonating properties of the piezoelectric plate are protected and prevented from deteriorating by forming an opening partially surrounding the resonating part.

The substrate having a depression is abraded to form a hole in the substrate, so that the bottom resonating electrode is easily drawn out. Drawing out the bottom resonating electrode becomes easy by the method of the invention which includes the steps of forming an electrode film on the depression of a substrate and then forming an intermediate support layer on the electrode film. As a result of these steps, a space is formed between the piezoelectric plate and the resonating electrode.

Glass or an organic material which melts at a temperature lower than the temperature that will deteriorate the properties of the piezoelectric plate is used as an intermediate support layer, so that a piezoelectric acoustic wave device is manufactured without deteriorating the properties of the material. Examples of the organic material include waxes, poly(vinyl acetate), polystyrene, poly(vinyl alcohol), poly (vinyl butyral), polysulfone, polyimide, nylon, polycarbonate, polyacetal, polyethylene, polypropylene and the like.

The piezoelectric plate can be appropriately selected from known materials. The piezoelectric plate is preferably made of at least one material selected from the group consisting of quartz, lithium niobate and lithium tantalate, so that direct bonding between the piezoelectric plate and the substrate is easily formed, and a piezoelectric acoustic wave device with excellent properties is obtained.

The invention is now specifically explained by referring to the following examples. The examples are illustrative and should not be construed as limiting the invention in any way.

EXAMPLE 1

Figures 2A, 2B, 2C, 2D:
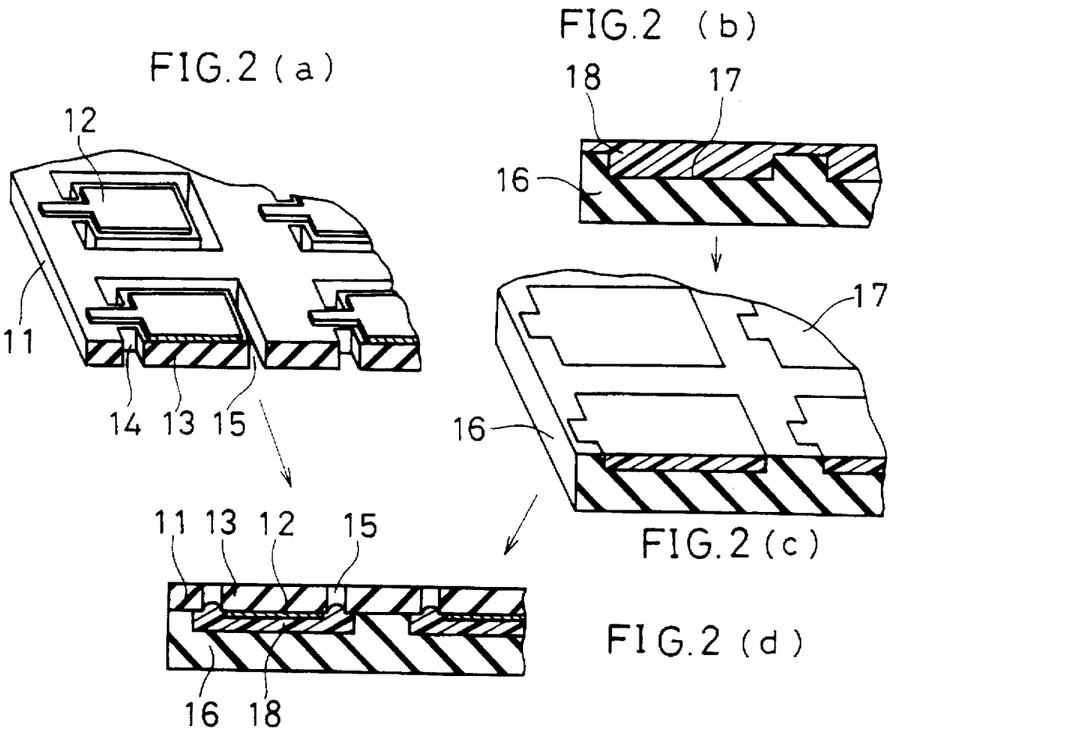
Figure 2E:
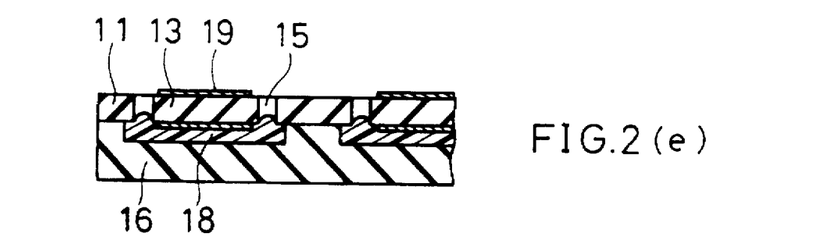
Figure 2F:
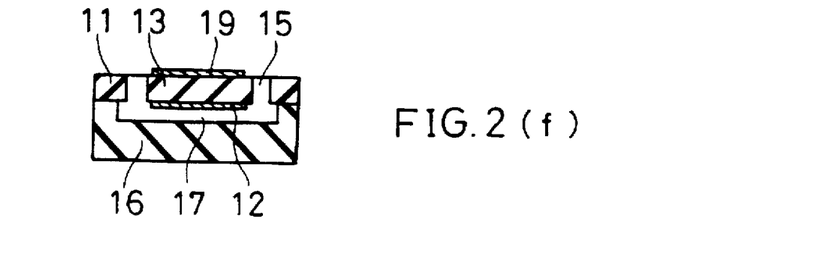

A method of manufacturing a piezoelectric acoustic wave device of this example is explained by referring to FIGS. 2 (a), 2 (b), 2 (c), 2 (d), 2 (e) and 2 (f).

An AT-cut quartz was used for a piezoelectric plate 11. Bottom electrodes 12 were formed on one surface of piezoelectric plate 11; openings 15 were formed partially surrounding support parts 14 of piezoelectric plate 11 to create resonating parts 13 having a one side-supported beam structure. A sand blasting method was applied to form these openings while a photo-resist pattern was formed on the surface of the piezoelectric plate as a mask. (See FIG. 2(a).)

An At-cut quartz was also used for a substrate 16. Depressions 17 larger than bottom electrodes 12 were formed in substrate 16 by a sand blasting method. While substrate 16 was heated to 150° C., Electron Wax (yellow wax No. 6A manufactured by Nikka Seiko Co., Ltd.) having about a 60° C. softening point was coated on the entire surface of the substrate as an intermediate support layer 18. The principal components of Electron Wax are natural rosin and natural wax. (See FIG. 2 (b).)

The top surface of the intermediate support layer was abraded, so that substrate 16 and the filled depressions formed a flat surface (FIG. 2 (c).)

Piezoelectric plate 11 and substrate 16 were washed with a solution, which was a mixture of ammonia, hydrogen peroxide and water at a ratio of 1:1:6 by volume (hydrophilic treatment). —OH groups were added to the treated surfaces of piezoelectric plate 11 and substrate 16, so that the surfaces became hydrophilic.

The surface of piezoelectric plate 11 formed with bottom electrode 12, and the top surface of substrate 16 having the exposed surfaces of intermediate support layers 18 were bonded together. Piezoelectric plate 11 and substrate 16, at the sections where the plate and the substrate were directly in contact with each other, were bonded by the hydrogen bonding of the -OH groups. By adding pressure to the bonded piezoelectric plate 11 and substrate 16 at 150° C., the wax of intermediate support layers 18 softened and rose to the openings of the piezoelectric plate at a thickness of bottom electrode 12. Bottom electrodes 12 were arranged to be inside depressions 17 of the substrate.

The direct bonding of piezoelectric plate 11 and substrate 16 became strong at the atomic level by a heating treatment at 300° C. (FIG. 2 (d)). Since quartz used for the plate and the substrate has a 573° C. α-β transition point, the plate and the substrate are preferably treated with heat at a temperature lower than the transition point. Thus, the properties of the material of the plate and the substrate are protected.

The top surface of piezoelectric plate 11 was abraded, and the plate became 10 μm thick. Top electrodes 19 were formed on piezoelectric plate 11. (See FIG. 2 (e).)

Each element (in other words, each piezoelectric acoustic wave device) was separated by a dicing device. Finally, the wax of intermediate support layers 18 was dissolved and removed by trichloroethylene. (See FIG. 2 (f).) Trichloroethylene can easily penetrate through the layers because of openings 15.

Figure 1:
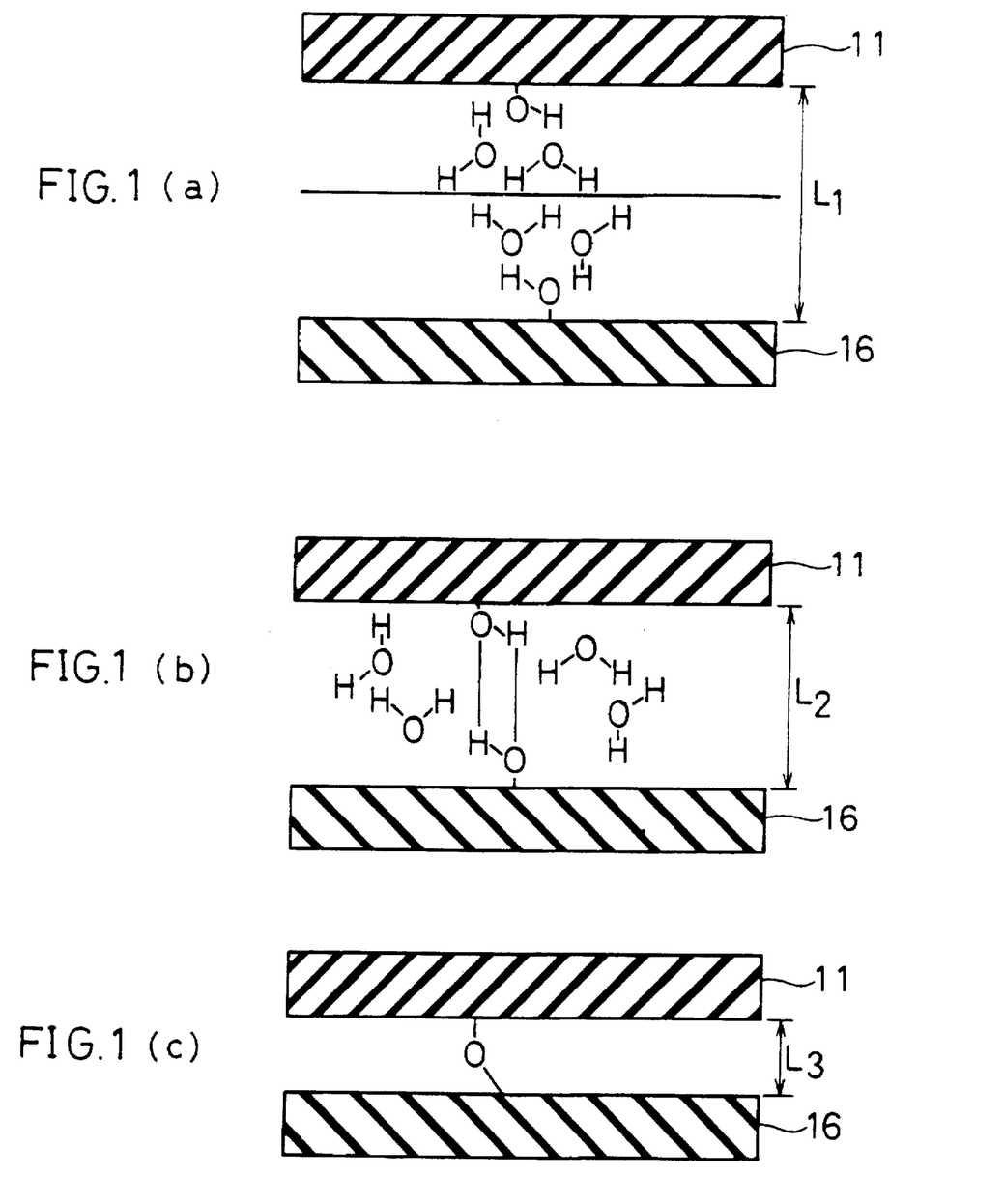

FIGS. 1 (a), 1 (b) and 1 (c) show the steps of directly bonding the interfaces of piezoelectric plate 11 and substrate 16. The interfaces of substrate 16 and piezoelectric plate 11 are bonded together by the hydrogen bonds of hydrophilic groups and water molecules at the interfaces before heat treatment (FIG. 1 (a)). The water molecules at the interfaces are removed by heat treatment, thus forming strong covalent bonds among crystal composing atoms (FIG. 1 (c)). FIG. 1 (b) shows the bonding condition between piezoelectric plate 11 and substrate 16 after heat treatment at 150° C.; the distance between piezoelectric plate 11 and substrate 16 in FIG. 1 (a) ($L_1$=70 nm) becomes 35 nm ($L_2$) after the treatment. After heating the interfaces at 300° C., the water molecules are completely removed from the interfaces (FIG. 1 (c)), and the distance between Piezoelectric plate 11 and substrate 16 ($L_3$) then becomes 16 nm.

In other words, the interfaces of substrate 16 and Piezoelectric plate 11 are directly bonded together in the following steps:

bonding the interfaces by the hydrogen bonds of hydrophilic groups and water molecules at the interfaces; and removing the water molecules at the interfaces by heat treatment, thus forming strong covalent bonds among crystal composing atoms.

Since the interfaces are directly bonded to each other at an atomic level, the bond strength is significantly high. The size of a piezoelectric acoustic wave device can also be extremely small because an extra area is not required to glue the piezoelectric plate to the substrate. Additionally, because an organic adhesive is not used in this method, gas from the adhesive is not generated. Thus, the piezoelectric acoustic wave device becomes resistant to heat and vibrations.

When a substrate and a piezoelectric plate are directly bonded to each other by a chemical bond, an abrasion treatment is easily carried out on the piezoelectric plate and the substrate. Depending on the materials used for the substrate and the piezoelectric plate, an oxide film (or buffer layer) is sometimes formed at the interfaces of the plate and the substrate by direct bonding.

When an adhesive is used to fix a piezoelectric plate on a substrate, some treatments such as photolithography can harm the adhesive layer. However, these treatments do not have a negative impact on the direct bonding of a piezoelectric plate and a substrate. The direct bonding is also stronger than the adhesion of an adhesive. An excessive area is not required for direct bonding, whereas an excessive area is required for an adhesive. Therefore, the element is easily miniaturized when a piezoelectric plate is directly bonded to a substrate. Unlike an adhesive, gas and moisture are not generated by direct bonding processes; the processes are particularly suitable for fixing devices and bonding packages which are sensitive to humidity and gas.

In the manufacturing method of this example, the treatments of thinning a piezoelectric plate, forming electrodes on the thinned piezoelectric plate and separating the resonating part of the piezoelectric plate from the substrate are easily performed.

EXAMPLE 2

Figure 3:
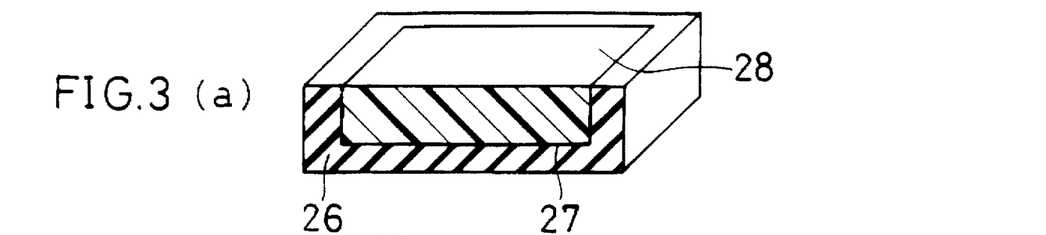

This example is explained by referring to FIGS. 3 (a), 3 (b), 3 (c), 3 (d), 3 (e) and 3 (f).

Lithium tantalete was used for a substrate 26, and a depression 27 was formed in substrate 26. A glass layer having about a 300° C. softening point was filled in depression 27 as an intermediate support layer 28, and was abraded. Thus, substrate 26 and the filled depression formed a flat surface. (See FIGS. 3 (a) and (b)).

A lithium tantalate piezoelectric plate 21 was directly bonded on substrate 26 as described in Example 1. Since the Curie point of lithium tantalate is 603° C., piezoelectric plate 21 was treated with heat at 400° C. (See FIG. 3 (c).)

Piezoelectric plate 21 bonded to substrate 26 was abraded to 10 μm. The bottom surface of substrate 26 was also abraded to expose intermediate support layer 28. A top electrode 29 was formed on piezoelectric plate 21. (See FIG. 3 (d).)

An opening 25 was formed in piezoelectric plate 21, so that the resonating part of piezoelectric plate 21 had a one side-supported beam structure. Intermediate support layer 28 made of glass was etched and dissolved with thin hydrofluoric acid. A bottom electrode 22 was then formed on the back sides of piezoelectric plate 21 and substrate 26. (See FIGS. 3 (e) and 3 (f).)

Lithium tantalate piezoelectric plate 21 was directly bonded to intermediate support layer 28 made of glass as shown in FIGS. 1 (a), 1 (b) and 1 (c), and a strong direct bonding was achieved in this example. Since the surfaces of the substrate and the plate for direct bonding were not rough, the bonding was completed with their own attractive forces. Thus, it was not necessary to add pressure to these surfaces in direct bonding processes.

EXAMPLE 3

Figure 4:
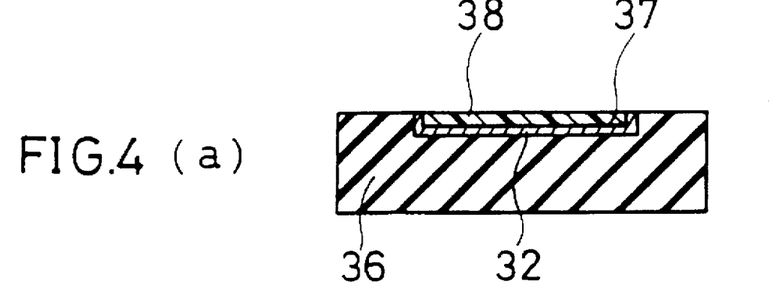

This example is explained by referring to FIGS. 4 (a), 4 (b), 4 (c) and 4 (d).

A depression 37 was formed in a substrate 36; a bottom electrode 32 was formed on depression 37; an intermediate support layer 38 was then formed on bottom electrode 32 and was abraded. Therefore, as shown in FIG. 4 (a), depression 37 was filled with intermediate support layer 38, and bottom electrode 32 was buried under the support layer.

As shown in FIGS. 1 (a), 1 (b) and 1 (c), a piezoelectric plate 31 was directly bonded on substrate 36 and was abraded (FIG. 4 (b)).

An opening 35 was formed in piezoelectric plate 31, so that the resonating part of the plate had a one side-supported beam structure. Intermediate support layer 38 was etched to expose a part of bottom electrode 32, which was right below opening 35. A top electrode 39 was formed on piezoelectric plate 31. Lead electrode 39a was also formed on piezoelectric plate 31 as a lead part for bottom electrode 32. (See FIG. 4 (c).)

Intermediate support layer 38 was dissolved and removed, thus forming a space between piezoelectric plate 31 and bottom electrode 32 (FIG. 4 (d)). As a result, a capacity coupling-type resonator was manufactured in this example.

EXAMPLE 4

Figure 5:
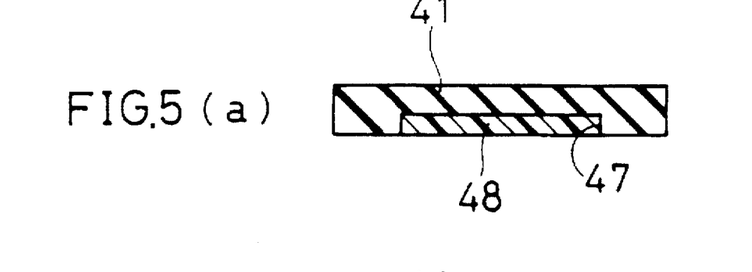

This example is explained by referring to FIGS. 5 (a), 5 (b), 5 (c) and 5 (d).

Lithium niobate was used for a piezoelectric plate 41. A depression 47 was formed in the plate; Electron Wax described in Example 1 was coated on depression 47 as an intermediate support layer 48 and abraded. Thus, depression 47 was filled with intermediate support layer 48 (FIG. 5 (a)).

A 0.2 μm thick aluminum was deposited on the top surface of a substrate 48 as a bottom electrode 42. As shown in FIGS. 1 (a), 1 (b) and 1 (c), substrate 46 and piezoelectric plate 41 were directly bonded to each other. The top surface of piezoelectric plate 41 on substrate 46 was abraded. (See FIG. 5 (b).)

An opening 45 was formed in piezoelectric plate 41, so that the resonating part of the plate had a one side-supported beam structure. Intermediate support layer 48 was etched to expose a part of bottom electrode 42, which was right below opening 45. A top electrode 49 was formed on piezoelectric plate 41; a lead electrode 49a was also formed partially on bottom electrode 42 and piezoelectric plate 41. (See FIG. 5 (c).)

Intermediate support layer 48 was dissolved and removed, thus forming a space between piezoelectric plate 41 and bottom electrode 42. As a result, a capacity coupling-type resonator was manufactured. (See FIG. 5 (d)).

The effect of a resonator having depressions in both substrate 46 and piezoelectric plate 41 would be the same as the resonator of this example in which depression 47 is formed only in piezoelectric plate 47.

Even though the order of the manufacturing steps described above is variable, the same effect is obtained in the invention as long as a piezoelectric plate is bonded on a substrate via an intermediate support layer during complex treatments.

A piezoelectric plate is directly bonded to a substrate particularly well, if the piezoelectric plate is made of quartz, lithium tantalete, lithium niobate or lithium tetraborate ($Li_2B_4O_7$) and the substrate is made of quartz, silicon, glass, lithium tantalate, lithium niobate or GaAs. Any combination of these materials is particularly effective for the direct bonding. It is also possible to create a stronger direct bonding between a piezoelectric plate and a substrate by forming an oxide film or a buffer layer made of silicon nitride at the interfaces of the plate and the substrate. Moreover, by applying a strong electric field to the interfaces during the direct bonding processes, ions around the interfaces migrate, so that a strong direct bonding between the piezoelectric plate and the substrate is formed at low temperature.

It is, however, preferable to use the same materials for the substrate and piezoelectric plate, since the properties of a piezoelectric acoustic wave device may deteriorate due to stress caused by changes in temperature at the interfaces of the plate and substrate.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A method of manufacturing a frequency thickness resonant mode piezoelectric acoustic wave device, said device comprising a piezoelectric plate having a top surface and a bottom surface, a substrate having a top surface and a bottom surface, and exciting electrodes, said exciting electrodes contacting and exciting a resonating part of said piezoelectric plate, comprising:

digging into at least one of said substrate and said piezoelectric plate to form a depression having an area larger than the area of said resonating part of said piezoelectric plate;

bonding the top surface of said substrate and the bottom surface of said piezoelectric plate around said depression by chemical treatment without an adhesive with said resonating part overlying said depression;

introducing an intermediate support material into said depression to form an intermediate support layer which supports and fixes said resonating part of said piezoelectric plate relative to said substrate;

thinning at least said resonating part of said piezoelectric plate; and removing said intermediate support material after said thinning step.

2. The method according to claim 1, wherein said piezoelectric plate is formed with an opening partially surrounding said resonating part of said piezoelectric plate.

3. The method according to claim 1, wherein after said thinning step, said bottom surface of said substrate is abraded to form a hole in said substrate below said depression.

4. The method according to claim 1, wherein the bottom electrode is formed on the depression of the substrate by the steps of forming an electrode film on the depression of the substrate, forming the intermediate support layer on said electrode film, and abrading said intermediate support layer, and wherein a lead electrode is formed on the piezoelectric plate as a lead part for said bottom electrode.

5. The method according to claim 1, wherein the bottom electrode is formed at least on the bottom surface of the resonating part.

6. The method according to claim 1, wherein the bottom electrode is formed on the top surface of the substrate, and wherein a lead electrode is formed partially on said bottom electrode and the piezoelectric plate as a lead part for said bottom electrode.

7. The method according to claim 1, wherein the intermediate support layer is made of at least one material selected from the group consisting of glass and organic materials softening at a temperature lower than a temperature that will deteriorate the properties of the piezoelectric plate.

8. The method according to claim 1, wherein the piezoelectric plate is made of at least one material selected from the group consisting of quartz, lithium niobate and lithium tantalate.

9. The method according to claim 1, wherein the substrate is made of at least one material selected from the group consisting of quartz, silicon, glass, lithium niobate and lithium tantalate.

* * * * *